United States Patent [19]

Schluge et al.

[11] Patent Number: 5,003,553
[45] Date of Patent: Mar. 26, 1991

[54] SPREAD SPECTRUM PHASE LOCKED LOOP WITH PHASE CORRECTION

[75] Inventors: Gregory Schluge; Edmund S. Zavada, both of Charlottesville, Va.

[73] Assignee: Sperry Marine Inc., Charlottesville, Va.

[21] Appl. No.: 398,218

[22] Filed: Aug. 23, 1989

[51] Int. Cl.$^5$ .............................................. H04K 1/02
[52] U.S. Cl. ...................................................... 375/1
[58] Field of Search ........................ 375/1; 380/34, 50

[56] References Cited

U.S. PATENT DOCUMENTS

| | | | |
|---|---|---|---|
| 4,543,657 | 9/1985 | Wikinson | 375/1 |
| 4,617,674 | 10/1986 | Mangolis | 375/1 |
| 4,852,121 | 7/1989 | Kingston et al. | 375/1 |

Primary Examiner—Salvatore Cangialosi
Attorney, Agent, or Firm—Seymour Levine

[57] ABSTRACT

A global positioning system (GPS) receiver includes a phase locked loop that locks to the carrier signal from the GPS satellite at an offset frequency in order to recover the GPS data. The loop includes a phase shifter driven by a system clock through a synchronous clock inversion circuit. The phase of the system clock is periodically inverted synchronously with respect to the clock in order to compensate for the offset loop frequency so that the loop does not lose lock because of the offset error.

7 Claims, 3 Drawing Sheets

SPREAD SPECTRUM PHASE LOCKED LOOP WITH PHASE CORRECTION

CROSS-REFERENCE TO RELATED APPLICATIONS

The following pending applications relate to and are assigned to the assignee of the present invention and are incorporated herein in their entirety:

Ser. No. 290,967, filed Dec. 28, 1988, "Spread Spectrum Long Loop Receiver" by F. W. Phillips, K. L. Mahoney and E. S. Zavada.

Ser. No. 318,583, filed Mar. 3, 1989, "Spread Spectrum Squaring Loop With Invalid Phase Measurement Rejection", by D. H. Garodi, F. W. Phillips and G. Schluge.

BACKGROUND OF THE INVENTION

1. Field of the Invention

The invention relates to spread spectrum communication, particularly with respect to Global Positioning System (GPS) receivers where phase lock is maintained at an offset frequency in order to recover data.

2. Description of the Prior Art

The GPS is a navigation system utilizing a plurality of satellites in diverse orbital positions. Each satellite transmits an L-band carrier bi-phase modulated by a 50 baud navigation data message. The spectrum of the carrier with the data modulated thereon is spread by bi-phase modulating the carrier with a spectrum spreading Pseudo Randon Noise (PRN) code identifying the satellite. In the present day system, the carrier frequency is 1575.42 MHz and the PRN code has a clock rate of 1.023 MHz with a code length of 1023 bits. The code repeats the predefined sequence thereof once each millisecond (1 KHz repetition rate).

In order to receive the GPS signal structure, a GPS receiver generates an exact duplicate of the spreading code and aligns it in time to the receive code using correlation techniques. Specifically, code correlation at the receiver involves the application of the identical code to a mixer in the receiver RF section which inserts phase shifts into the IF frequencies tending to reconstruct the carrier or "despread" the received signal. The phase of the local code is incrementally shifted until the bi-phase mixing of the locally generated code exactly coincides with the satellite bi-phase modulated received signal. The receiver thus removes the spreading code from the carrier (unmodulates the carrier) leaving only the bi-phase 50 baud data message thereon. The data message is used by the GPS receiving equipment to solve the navigation problem.

As is appreciated, the signal received from the orbiting satellite often contains a rapidly varying doppler frequency component which must be tracked by the receiver phase locked loop. In order to demodulate the data message, the GPS receiver must phase lock thereto and coherently detect each bit. Prior art methods of recovering the data and the shortcomings thereof are described in said Ser. No. 290,967, and Ser. No. 318,583. For example, the Costas loop, which has twice the complexity and therefor twice the cost and size of the present invention, extracts the data by locking directly thereto.

In the receiver of said Ser. No. 290,967 and Ser. No. 318,583, the output of the phase locked loop provides a constant offset frequency instead of the conventional DC term to provide a data modulated carrier for the data detection circuitry. The receiver phase locked loop tends to track and follow the doppler frequency from the received orbiting satellite. However, the phase error that remains from the offset frequency would, if uncompensated, precipitiously result in lock failure. This occurs because the frequency of the loop voltage controlled oscillator is controlled by a signal containing an offset (caused by the loop offset frequency) with respect to the oscillator control signal appropriate for stable tracking of the receive frequency. Some prior designs continuously exercise the correlation lock algorithm to track out the error frequency. This approach results in greatly increased loading on the receiver processing circuitry with a concomitant substantial increase in the cost thereof. Once the correlation lock is achieved, it is desirable to terminate the correlation algorithm thus greatly reducing the overhead of the receiver processing elements with a concomitant lower cost thereof.

In prior art designs, similiar to that of said Ser. No. 290,967 and Ser. No. 318,583, pulse stealing circuits are utilized to compensate for the loop offset frequency. Such pulse stealing circuits involve, for example, the periodic removal of a state in a programmable counter circuit that forms part of the loop phase shifter circuitry. The loop phase shifter circuitry effects the phase adjustments of the local oscillator relative to the received signal in endeavoring to achieve loop lock both during the execution of the code correlation algorithm and after the algorithm is terminated so as to maintain lock on the received carrier. The prior art design of such systems require a predetermined frequency to operate the phase correction circuitry in order to effect periodic phase corrections of a predetermined number of nanoseconds every predetermined number of milliseconds. At high doppler frequencies, the granularity of the correction may be marginal for maintaining lock. In order to increase the resolution, it would be necessary to increment the phase by, for example, one-half the number of nanoseconds at one-half the periodicity. Such an increase in offset frequency compensation resolution would necessitate that the system clock frequency be doubled.

The receiver of Ser. No. 290,867 and Ser. No. 318,583 utilize this pulse stealing technique to control phase lock to the doppler frequency. The system design utilizes a maximum frequency of 10 MHz to operate the phase correction circuitry. To use this design for such phase corrections, the phase should be retarded by 100 nanoseconds every 308 milliseconds. At high doppler frequencies, this granularity is marginal for maintaining lock. In order to increase the resolution, it would be necessary to retard the phase by 50 nanoseconds every 154 milliseconds requiring that the frequency of the system clock be increased to 20 MHz. Such an increased clock frequency would adversely effect system reliability and producibility. The complexity of the design would have doubled.

The disadvantages of the prior art approaches have a substantial economic impact by resulting in added complexity, increased development time, double the system software throughput at high interrupt rates and increased parts count. These considerations apply to the Costas loop designs requiring two separate loops with separate local oscillator sections (in-phase and quadrature) as well as to the squaring loop designs utilizing an inordinately high frequency system clock to effect system off-lock error compensation at the resolution required at the normally high doppler frequencies encountered.

U.S. Pat. No. 4,457,006; issued June 26, 1984; entitled "Global Positioning System Receiver", by R. E. Maine discloses a GPS receiver similar to the receivers discussed above and suffering from the disadvantages described. Said U.S. Pat. No. 4,457,006 is incorporated herein by reference.

SUMMARY OF THE INVENTION

The above-described disadvantages of the prior art are overcome by passing the system clock into the receiver phase shifter through a clock inversion circuit. Offset frequency compensation is effected by repeatedly inverting the system clock at a periodicity appropriate to the amount of compensation required. This technique provides the offset frequency compensation resolution otherwise obtainable with a system clock of twice the frequency.

DESCRIPTION OF THE PREFERRED EMBODIMENT

Figure 1:
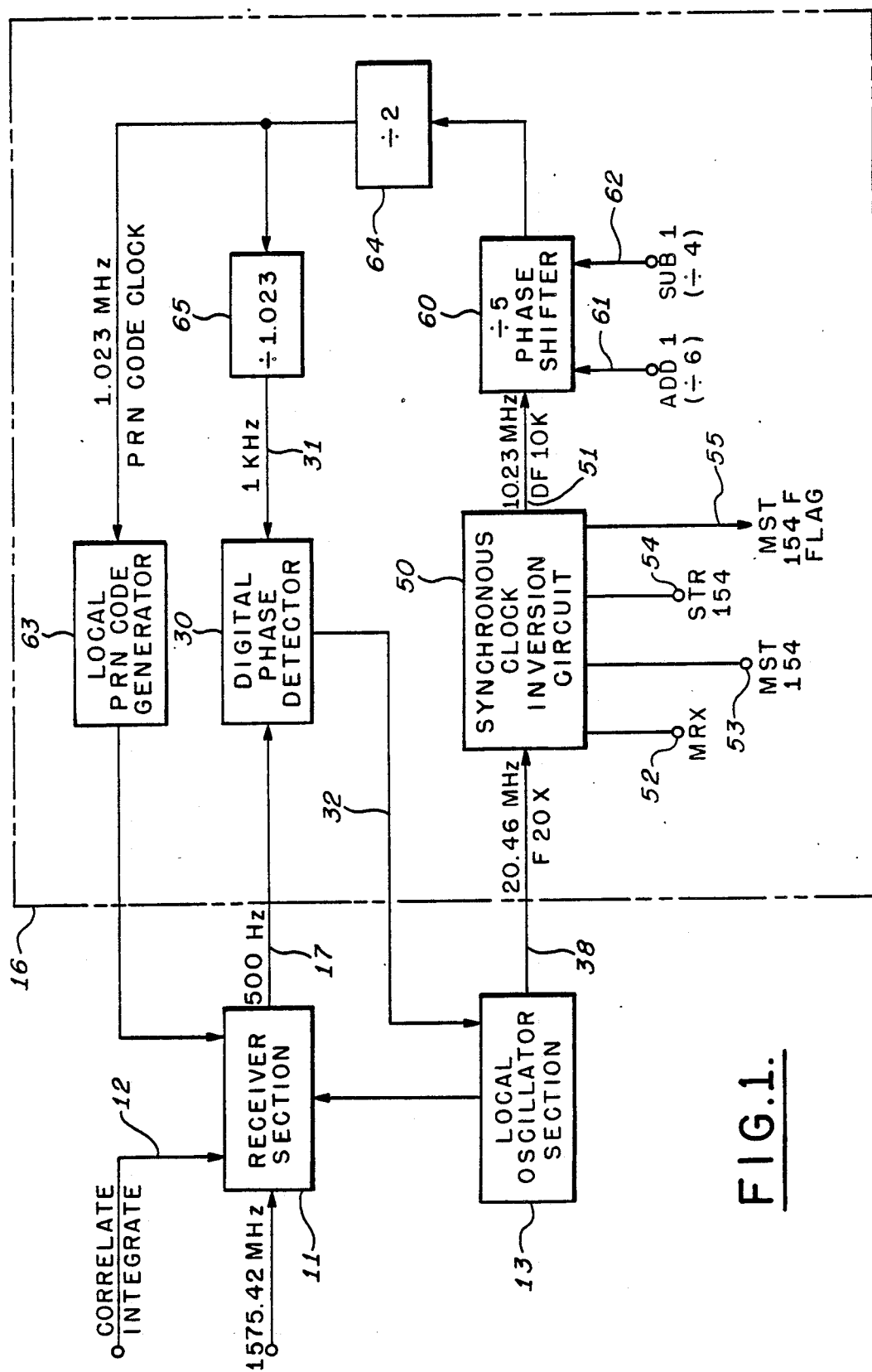
FIG. 1 is a schematic block diagram based on the GPS receiver of said Ser. No. 290,967 and Ser. No. 318,583 utilizing the system clock inversion of the present invention.

Referring to FIG. 1, a schematic block diagram of a GPS receiver utilizing the present invention is illustrated. Details of the receiver of FIG. 1 are described in said Ser. No. 290,967 and Ser. No. 318,583 and the reference numerals of FIG. 1 of Ser. No. 290,967 are utilized herein to designate the same components with respect thereto. The 1575.42 MHz BPSK RF signal is applied to receiver section 11 and is down converted to the 500 Hz hard limited last IF signal on a line 17. The last IF on the line 17 is bi-phase modulated by the 50 baud data. The input RF is down converted in the manner described in said Ser. No. 290,967 by the local oscillator section 13. As described in said Ser. No. 290,967 and Ser. No. 318,583, the input RF signal bi-phase modulated by the PRN spreading code is correlated in the receiver section 11 by a locally generated code duplicate provided on the path 24. Application and termination of the correlation algorithm is controlled by a correlation-integrate signal on a line 12. The 20.46 MHz local oscillator output (F20X) from the local oscillator section 13 is applied on the line 38 to the digital section 16. The clock F20X synchronizes the digital circuitry to the received RF signal as described in said Ser. No. 318,583. As described in said Ser. No. 318,583, the phase and period of the 500 Hz hard limited last IF on the line 17 are measured by high speed digital circuitry with respect to the 1 KHz loop reference frequency on the line 31 to tune the RF circuitry of the receiver section 11 to the correct satellite doppler offset. As explained in said Ser. No. 90,967 and Ser. No. 318,583, the high speed digital circuitry represented by the digital phase detector 30 provides an error signal on a line 32 to the local oscillator section 13 to control the 20.46 MHz voltage controlled oscillator (VCO) contained therein to reduce the loop error signal on the line 32 to zero. In this manner, the phase of the last IF 500 Hz hard limited signal on the line 17 is continuously monitored with respect to the 1 KHz reference on the line 31 endeavoring to maintain the loop phase locked to the incoming RF carrier including the doppler frequency offset thereof. However, in a manner to be explained, the 500 Hz signal on the line 17 introduces an off-lock error term that must be compensated to achieve lock stability.

In accordance with the present invention and in a manner to be described in detail hereafter, the synchronizing clock F20X is applied through a synchronous clock inversion circuit 50 to provide a phase corrected clock DF10X on a line 51. The DF10X clock has a frequency of 10.23 MHz. As explained in said Ser. No. 290,967, the F20X synchronizing clock derives the 500 Hz last IF on the line 17 via the local oscillator section 13 and the receiver section 11. Because of circuit design, the F20X signal is stable only on the falling edges thereof In a manner to be explained, the falling edges of the F20X signal are utilized to square the F20X signal to 10 MHz by digital circuits within the synchronous clock inversion circuit 50. The squared and phase corrected output DF10X is utilized when counting the last IF hard limited phase and frequency as described in said Ser. No. 318,583. In a manner to be explained hereafter in detail, the synchronous clock inversion circuit 50 is responsive to a system master reset control (MRX) at an input 52, a correlation timing strobe (MST154) on an input 53 and a strobe reset signal (STR154) on an input 54. The circuit 50 also provides a correction flag (MST154F) on an output 55.

The DF10X synchronizing clock on the line 51 is applied through a programmable divide-by-five counter and phase shifter 60. In single cycle operation, the counter 60 is programmable to divide by six by issuing an add one command to an input 61 and to divide by four by issuing a subtract one command to an input 62. Such single cycle operation will either advance or retard phase by approximately 100 nanoseconds, respectively. The phase shifter 60 effects the phase adjustments of the local code on the line 24 with respect to the receive code of the 1575.42 MHz RF input when the code correlation algorithm is active.

The shifted clock output from the phase shifter 60 is applied to a local PRN code generator 63 through a divide by two circuit 64. Thus, the DF10X clock signal is divided by ten to provide a 1.023 MHz PRN code clock to the code generator 63 to generate the local PRN code on the line 24 as described above. The 1.023 MHz clock from the divider 64 provides the 1 KHz reference clock on the line 31 through a divide-by-1023 circuit 65.

In operation of the receiver of FIG. 1, the local PRN code on the line 24 is shifted into exact alignment with the receive code by executing the correlation lock algorithm to track out the doppler. By known circuits (not shown), the correlation detector causes the phase of the PRN code clock to be advanced and retarded in 100 nanosecond increments until alignment is achieved. The correlation algorithm is then terminated and the loop endeavors to maintain lock by adjusting the local oscillator section 13 via the error signal on the line 32. The 500 Hz hard limited last IF on the line 17 is then utilized by conventional demodulation circuitry to extract the 50 baud data.

As described above, the 500 Hz component in the loop tracking term must be compensated to achieve loop stability. This may be accomplished by issuing a subtract one command to the input 62 of the phase shifter 60 every 308 milliseconds to extract 100 nanoseconds of phase to effect the compensation. As described above, this granularity is marginal for maintaining lock at high doppler frequencies. In order to increase the resolution, it is desirable to retard the phase by 50 nanoseconds every 154 milliseconds. Conventionally, this would be achieved by increasing the frequency of the DF10X stable clock signal to 20 MHz. Such an increase in clock frequency would adversely affect system reliability and reduce stability while doubling the complexity of the design. By utilizing the sychronous clock inversion circuit 50, in accordance with the invention, the increased resolution of phase retardation by 50 nanoseconds every 154 milliseconds to provide a synchronous 50 nanosecond phase shift is achieved by the 10 MHz clock.

Figure 2:
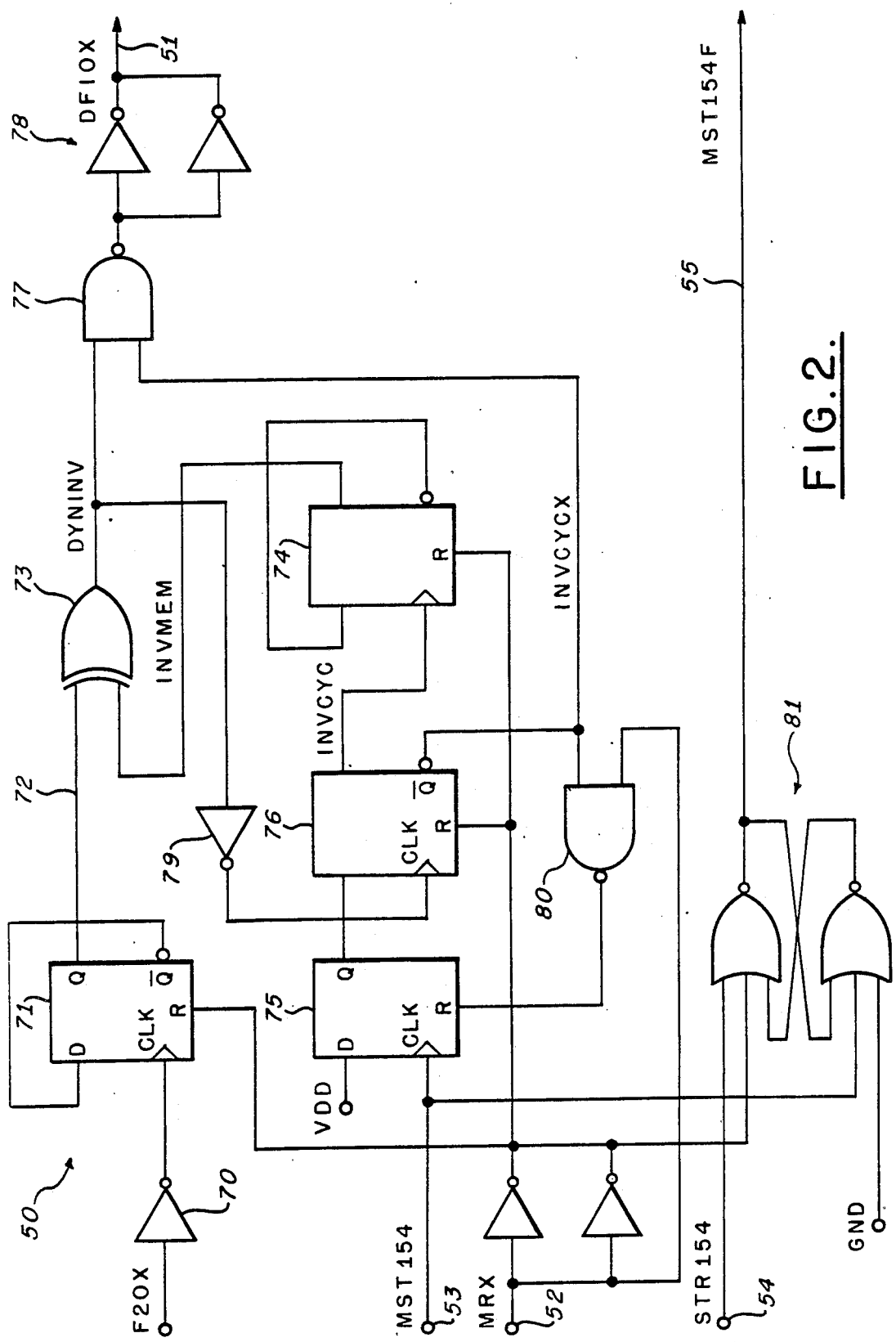
FIG. 2 is a schematic block diagram of the logic utilized to effect the clock inversion of the present invention.
Figure 3:
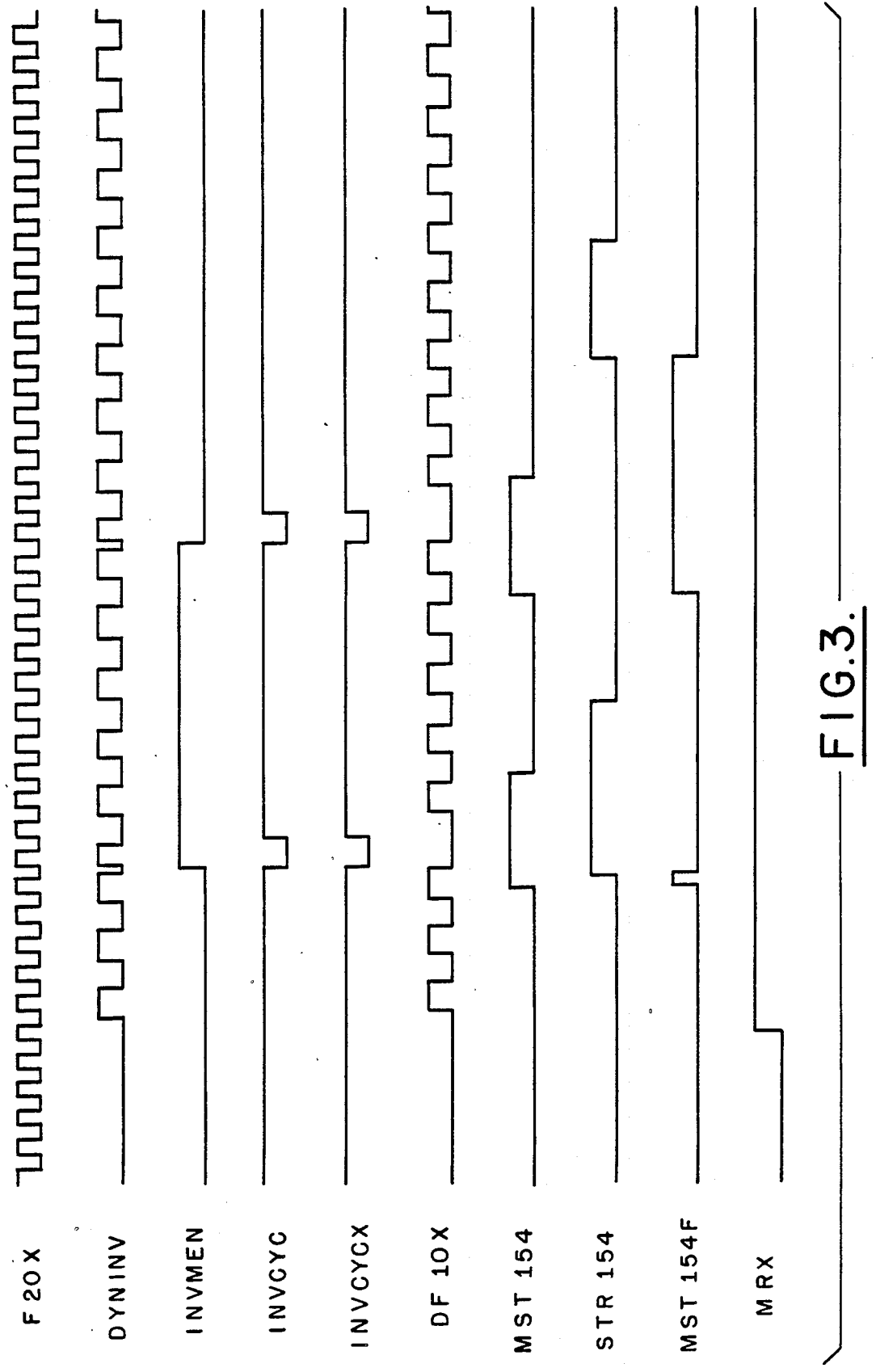
FIG. 3 is a waveform diagram illustrating waveforms at various points of the logic diagram of FIG. 2.

Referring to FIGS. 2 and 3, in which like reference numerals indicate like components with respect to FIG. 1, details of the synchronous clock inversion circuit 50 and digital waveforms pertinent thereto are illustrated, respectively. The signal F20X is the sychronizer clock provided by the local oscillator section 13 (FIG. 1) and is utilized to synchronize the digital circuitry of the digital section 16 (FIG. 1) to the received signal. F20X is applied through an inverter 70 to the clock input of a D-flip-flop 71. The flip-flop 71 is configured to toggle on each falling edge of F20X thereby squaring the F20X clock into a stable 10.23 MHz clock on a line 72.

The MRX signal is the system master reset control and is active in the low state thereof. The master reset signal MRX is asserted during a power up sequence of the receiver and is applied at input 52 of the error correction circuit 50. The 10.23 MHz clock on the line 72 is transmitted through an exclusive OR gate 73 producing the DYNINV signal. The DYNINV signal is the 10.23 MHz input frequency with inversion content manifested by additional edges contained therein resulting from the inversion process. DYNINV is generated by exclusively ORing the 10.23 MHz clock on the line 72 with the INVMEM signal. INVMEM is the output of a single bit inversion memory element 74 which stores the current state of the clock inversion. Thus, INVMEM represents the current clock inversion state and the level of INVMEM indicates the last inversion state. The inversion memory 74 is implemented by a D-flip-flop configured to toggle on rising edges of the clock input thereto.

The correlation timing strobe (MST154) is generated every 154 milliseconds. The diagram of FIG. 3 is compressed in time to illustrate two consecutive inversion cycles including one full cycle of the circuit operation. The rising edge of the correlation timing strobe (MST154) initiates the inversion process. The rising edge triggers the INVCYC signal via D-flip-flops 75 and 76 and INVCYC updates the inversion memory 74 with the current state of the clock inversion. Thus INVCYC is an internal synchronous control strobe which effects the synchronous inversion. The signal INVCYCX is the negation or inverse of the signal INVCYC. In order to remove the extraneous edges from DYNINV resulting from the inversion process, this signal is gated through a NAND gate 77 with the INVCYCX signal. The output of the NAND gate 77 provides the circuit output signal DF10X via parallel inverters 78. DF10X is the phase corrected clock utilized to effect the off-lock error correction. The clock DF10X is applied to the phase shifter 60 (FIG. 1) and corrects for the system off-lock error term as described above.

The correlation timing strobe (MST154) is applied as the clock input of the flip-flop 75, the D input of which is connected to logic 1. Thus, on a rising edge of MST154, the flip-flop 75 is triggered to the Q state thereof with the Q output thereof being connected to the D input of the flip-flop 76. The flip-flop 76 is clocked by DYNINV through an inverter 79. Thus, it is appreciated that the INVCYC strobe is generated synchronously with respect to the DYNINV signal. The Q-NOT output of the flip-flop 76 in combination with the MRX signal resets the flip-flop 75 through a NAND gate 80. The INVCYC strobe is then terminated by DYNINV via the inverter 79. When the master reset signal (MRX) goes low, flip-flops 71, 74 and 76 are reset. The reset state is released when MRX goes high.

The exclusive OR gate 73 transmits the clock on the line 72 unaltered when INVMEM is low and inverts the clock on the line 72 when INVMEM is high. The inversion memory 74 toggles in response to each requested inversion commanded by MST154. Thus, the phase of DYNINV is inverted for each assertion of MST154. It is appreciated that stealing one DYNINV pulse would result in a phase retardation of approximately 100 nanoseconds as described above. Since DYNINV and the inverse thereof are 180° out-of-phase with respect to each other, a 50 nanosecond phase retardation results from the phase inversion.

The signal MST154, in addition to initiating the synchronous clock inversion, sets the correction flag MST154F on the line 55 via a flip-flop 81. During the processing of the satellite pseudo ranges occurring every millisecond, system software reads this information bit. If the flag is asserted, the current millisecond data is not used in fixed computations. System software acknowledges and resets the flag by asserting STR154 at the strobe reset terminal 54. Thus, it is appreciated that the signal STR154 represents a computer generated strobe asserted after system software acknowledges the MST154F flag. The MST154F flag is asserted immediately preceding an inversion. The signal remains active until acknowledged by system software by assertion of the STR154 signal.

It is appreciated from the foregoing that the off-lock error equalizing term may be created by stealing a single code chip (approximately 100 nanoseconds) every 308 milliseconds. Every 308 milliseconds, or 154 pulses (cycles) of the 500 Hz last IF, the phase may be retarded by one DF10X pulse. This effectively lowers the output IF frequency by the amount of the error term. However, as described above, the granulatory or size of this phase reduction results in loop phase instability. The present invention removes one-half chip or approximately 50 nanoseconds every 154 milliseconds utilizing the clock inversion technique described above. By utilizing the clock inversion technique of the present invention, it is not necessary to increase the sampling frequency of 10 MHz.

It is appreciated from the foregoing that the present invention provides an exceedingly simple off-lock error correction circuit. The invention utilizes synchronous clock inversion on the 10 MHz clock to retard phase by 50 nanoseconds effectively providing the resolution of a 20 MHz clock without the disadvantages described above. A timing pulse of 154 milliseconds (MST154) is asserted at the circuit input to begin the inversion cycle. The flag (MST154F) is set to identify the unique millisecond timing interval that contains the phase correction. System software utilizes this information to avoid time interval measurements containing the phase correction.

Thus, the present invention utilizes clock inversion to effect the same resolution in phase shift circuits as achieved by pulse stealing networks operating at twice the frequency. The advantages of the invention are lower parts count, higher reliability, simpler architecture and lower system clock rate for the same resolution. Since the component count is significantly reduced, system reliability is increased and warranty costs may be accordingly reduced. The present invention provides a phase correction circuit for the spread spectrum correlation frequency.

While the invention has been described in its preferred embodiment, it is to be understood that the words which have been used are words of description rather than limitation and that changes may be made within the purview of the appended claims without departing from the true scope and spirit of the invention in its broader aspects.

We claim:

1. Phase correction apparatus for a spread spectrum phase locked loop, said phase locked loop including a system clock source for providing a system clock and a phase shifter for effecting loop phase adjustments, comprising control means for repeatedly providing a phase inversion signal, and clock inversion means responsive to said phase inversion signal and to said system clock for inverting said system clock in response to said phase inversion signal, thereby providing a phase corrected system clock, said phase shifter being responsive to said phase corrected system clock for effecting said loop phase adjustments.

2. The apparatus of claim 1 wherein said clock inversion means comprises clock logic means responsive to said system clock and a clock state signal for providing a clock logic means output signal comprising said system clock or the inverse thereof in accordance with said clock state signal, and clock state storage means responsive to said phase inversion signal for providing said clock state signal to said clock logic means, said clock state storage means toggling between first and second states in response to said phase inversion signal to control said clock logic means to provide said clock signal and said inverse thereof in accordance with said state of said clock state storage means.

3. The apparatus of claim 2 wherein said clock logic means comprises an EXCLUSIVE OR gate.

4. The apparatus of claim 2 wherein said clock state storage means comprises a flip-flop.

5. The apparatus of claim 2 wherein said control means includes synchronizing logic means responsive to said clock logic means output signal for providing said phase inversion signal synchronously with respect to said system clock.

6. The apparatus of claim 5 further including gating means responsive to said clock logic means output signal and coupled to said control means for gating extraneous edges from said clock logic means output signal to provide said phase corrected system clock.

7. The apparatus of claim 1 further including flag generation logic for generating a flag signal whenever said phase inversion signal inverts the phase of said system clock.

* * * * *